United States Patent
Tsai et al.

(10) Patent No.: US 8,735,249 B2
(45) Date of Patent: May 27, 2014

(54) TRENCHED POWER SEMICONDUCTOR DEVICE AND FABRICATION METHOD THEREOF

(75) Inventors: Yi-Yun Tsai, Penghu County (TW); Yuan-Shun Chang, Taipei (TW); Kao-Way Tu, New Taipei (TW)

(73) Assignee: Great Power Semiconductor Corp., New Taipei (TW)

( * ) Notice: Subject to any disclaimer, the term of this patent is extended or adjusted under 35 U.S.C. 154(b) by 0 days.

(21) Appl. No.: 13/115,951

(22) Filed: May 25, 2011

(65) Prior Publication Data

US 2012/0299091 A1    Nov. 29, 2012

(51) Int. Cl.
*H01L 21/326*    (2006.01)

(52) U.S. Cl.
USPC ....... 438/270; 438/268; 438/269; 257/E29.26

(58) Field of Classification Search
USPC ............. 257/331, E29.26; 438/270, 268, 269
See application file for complete search history.

(56) References Cited

U.S. PATENT DOCUMENTS

| | | | | |
|---|---|---|---|---|
| 6,563,131 | B1 * | 5/2003 | Adkisson et al. | 257/20 |
| 2003/0047779 | A1 * | 3/2003 | Peake et al. | 257/341 |
| 2008/0277688 | A1 * | 11/2008 | Tamada | 257/139 |

\* cited by examiner

*Primary Examiner* — Amar Movva
(74) *Attorney, Agent, or Firm* — Li & Cai Intellectual Property (USA) Office

(57) ABSTRACT

A trenched power semiconductor device on a lightly doped substrate is provided. Firstly, a plurality of trenches including at least a gate trench and a contact window are formed on the lightly doped substrate. Then, at least two trench-bottom heavily doped regions are formed at the bottoms of the trenches. These trench-bottom heavily doped regions are then expanded to connect with each other by using thermal diffusion process so as to form a conductive path. Afterward, the gate structure and the well are formed above the trench-bottom heavily doped regions, and then a conductive structure is formed in the contact window to electrically connect the trench-bottom heavily doped regions to an electrode.

7 Claims, 6 Drawing Sheets

TRENCHED POWER SEMICONDUCTOR DEVICE AND FABRICATION METHOD THEREOF

BACKGROUND OF THE INVENTION (1) Field of the Invention

This invention relates to a power semiconductor device and a fabrication method thereof, and more particularly relates to a trenched power semiconductor device and a fabrication method thereof.

(2) Description of the Prior Art

Planar power semiconductor device, such as a planar metal oxide semiconductor field effect transistor (MOSFET), which features a planar gate electrode on the substrate for controlling the gate channel parallel to the substrate, usually wastes a significant area for locating the planar gate electrode and thus restricts the reduction of cell pitch. In contrast, because the gate electrode of trenched power semiconductor device is embedded in the trench and the gate channel is shifted to vertical direction, cell pitch of the power semiconductor device can be further reduced to enhance integration.

FIG. 1 is a cross-section schematic view of a typical trenched MOSFET. As shown, the trenched MOSFET has an N-type heavily doped substrate 10, an N-type lightly doped epitaxial layer 12, a plurality of gate trenches 14, a plurality of gate structures 16, a plurality of P-type wells 17, a plurality of source regions 18, and an interlayer dielectric layer 19. Wherein, the N-type lightly doped epitaxial layer 12 is located on the N-type heavily doped substrate 10, the gate trenches 14 are formed in the N-type lightly doped epitaxial layer 12, and the gate structures 16 are located in the gate trenches 14. The P-type wells 17 surrounding the gate trenches 14 are formed in the upper portion of the N-type lightly doped epitaxial layer 12. A gate dielectric layer 15 encircling the gate structure 16 is utilized for separating the gate structures 16 and the P-type wells 17 as well as the N-type lightly doped epitaxial layer 12. The source region 18 is located in a surface layer of the P-type well 17 and surrounds the gate trenches 14. The interlayer dielectric layer 19 is located on the gate structure 16 and has a plurality of source contact windows formed therein to expose the source regions 18.

Generally, a source voltage of the trenched MOSFET is applied to the source regions 18 through a source metal layer (not shown) over the interlayer dielectric layer 19, a gate voltage is applied to the gate structures 16 through a gate metal layer (not shown) over the interlayer dielectric layer 19, and a drain voltage is applied to the N-type heavily doped substrate 10 through a drain metal layer (not shown) on the backside surface of the N-type heavily doped substrate 10. The electrodes on the opposite surfaces of the substrate restrict the usage of packaging technologies.

As mentioned above, the structure as well as the fabrication method of the trenched MOSFET is quite complicated. Thus, it is an important issue in the art to simplify the fabrication method of the trenched power semiconductor device in present

SUMMARY OF THE INVENTION

It is a main object of the present invention to provide a trenched power semiconductor device and a fabrication method thereof, which is capable to simplify the fabrication method and to reduce the cost.

It is another object of the present invention to provide a trenched power semiconductor device with an electrode on a top surface of the substrate.

To achieve the above mentioned embodiment, a trenched power semiconductor device formed on a lightly doped substrate is provided. The trenched power semiconductor device has a lightly doped substrate of a first conductive type, at least two trenches, a gate structure, at least two trench-bottom heavily doped regions, a contact window, and a conductive structure. The trenches are located in the lightly doped substrate and include at least a gate trench. The gate structure is located in the gate trench. The trench-bottom heavily doped regions are formed at the bottoms of the respective trenches, and the neighboring trench-bottom heavily doped regions are connected with each other to form a conductive path. The contact window is formed in the lightly doped substrate. The conductive structure is formed in the contact window for electrically connecting the trench-bottom heavily doped regions to an electrode.

According to an embodiment of the present invention, the trenches include at least a first trench and at least a second trench. The first trench is utilized for locating a gate bus and the second trench is utilized for locating a termination structure.

According to an embodiment of the present invention, the trenched power semiconductor device further has a window-bottom heavily doped region formed at a bottom of the contact window The conductive structure is electrically connected to the trench-bottom heavily doped regions through the window-bottom heavily doped region.

According to an embodiment of the present invention, the trenched power semiconductor device further has at least two heavily doped epitaxial structures located in the bottom portions of the respective trenches as a dopant source for forming the respective trench-bottom heavily doped regions in the lightly doped substrate.

According to an embodiment of the present invention, the trenched power semiconductor device further has at least two epitaxial structure located in the lower portions of the respective trenches, the gate structure is located on the epitaxial structure, and the epitaxial structure is of the lightly doped first conductive type or of the second conductive type.

According to an embodiment of the present invention, the opens of the contact window and the trenches are located on a top surface of the lightly doped substrate.

According to an embodiment of the present invention, the contact window encircles at least an edge of the lightly doped substrate.

According to the above mentioned trenched power semiconductor device, a fabrication method of a trenched power semiconductor device is also provided. The fabrication method comprises the steps of: a) providing a lightly doped substrate of a first conductive type; b) forming at least two trenches, which include at least a gate trench, in the lightly doped substrate; c) forming a contact window in the lightly doped substrate; d) forming at least two trench-bottom heavily doped regions located at the bottoms of the respective trenches; e) expanding the trench-bottom heavily doped regions by using the thermal diffusion process to have the neighboring trench-bottom heavily doped regions connected with each other; f) forming a gate structure in the gate trench; and g) forming a conductive structure in the contact window to electrically connect the trench-bottom heavily doped regions.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The main feature of the present invention is to adopt the conductive path composed of a plurality of trench-bottom heavily doped regions to replace the traditional heavily doped substrate such that the epitaxial layer on the substrate can be skipped to achieve the objects of reducing fabrication cost.

FIGS. 2A to 2G are schematic views showing a fabrication method of a trenched power semiconductor device in accordance with a first embodiment of the present invention. A trenched power MOSFET is described in the present embodiment as an example. However, the present invention is not so restricted. The idea of the present invention can be applied to other power semiconductor devices, such as the insulated gate bipolar transistor (IGBT).

Figure 1:
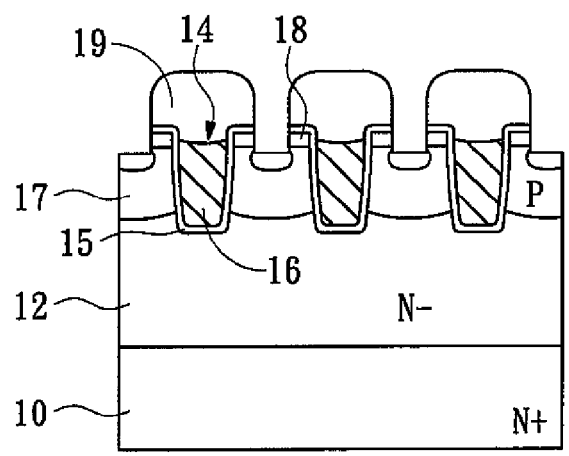
FIG. 1 is a schematic cross-section view of a typical trenched MOSFET.
Figure 2A:
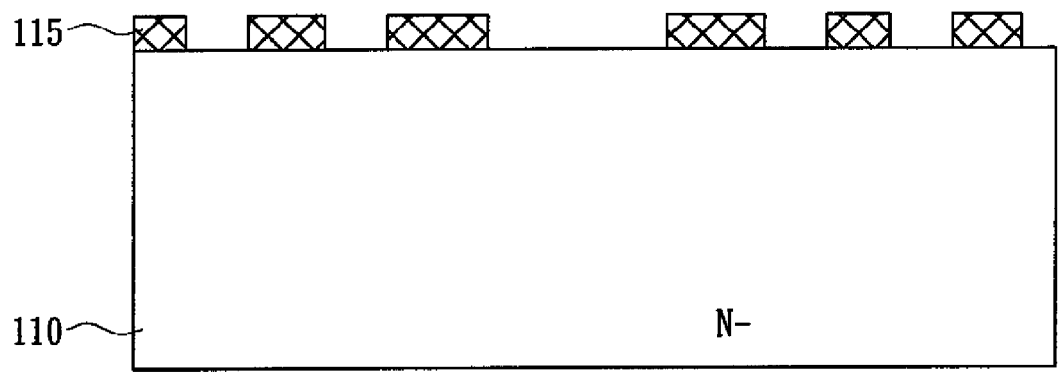
FIGS. 2A to 2G are schematic views showing a fabrication method of a trenched MOSFET in accordance with a first embodiment of the present invention.

As shown in FIG. 2A, firstly, an N-type lightly doped substrate 110 is provided to replace the N-type heavily doped substrate and the N-type lightly doped epitaxial layer which are required in the traditional manner. Thus, the fabrication step for forming the N-type epitaxial layer can be skipped in accordance with the present embodiment. Afterward, a pattern layer 115, such as a hard mask, is formed on the N-type lightly doped substrate 110 to define the location of trenches for locating the gate structure, the gate bus, the termination structure, and a contact window.

Figure 2B:
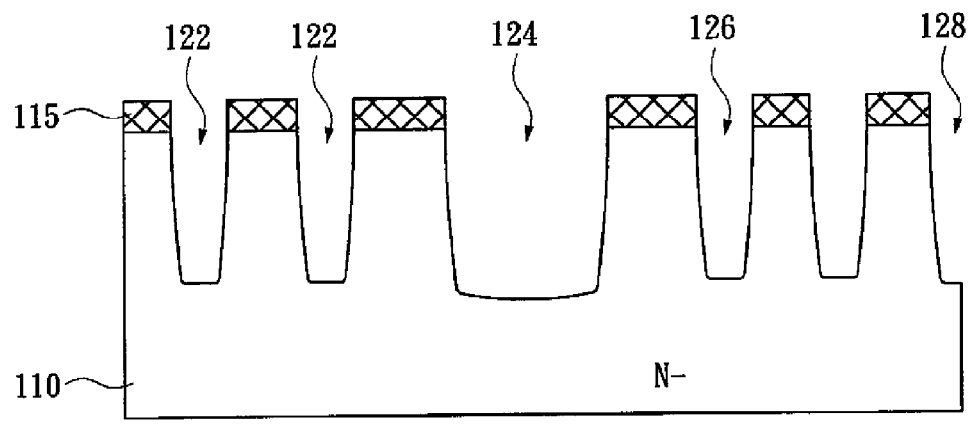
Figure 2C:
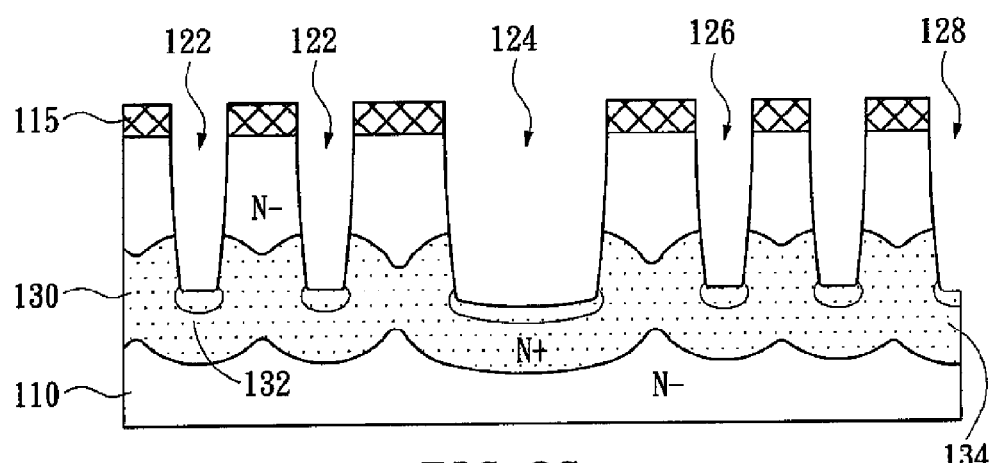

Thereafter, as shown in FIG. 2B, an etching step is carried out with a portion of the N-type light doped substrate 110 being shielded by the pattern layer 115 so as to form at least a gate trench 112 for locating the gate structure, at least a first trench 124 for locating the gate bus, at least a second trench 126 for locating the termination structure, and at least a contact window 128 on the N-type lightly doped substrate 110. The contact window 128 may be a trench or a stepped structure. Thereafter, as shown in FIG. 2C, an ion implantation step is carried out to implant high concentration N-type dopants in the bottoms of the gate trench 122, the first trench 124, the second trench 126, and the contact window 128 so as to form a plurality of trench-bottom heavily doped regions 132 at the bottoms of the gate trench 122, the first trench 124, and the second trench 126, and a window-bottom heavily doped region 134 at the bottom of the contact window 128. Next, a thermal diffusion step is carried out to expand the heavily doped regions 132,134 so as to have each of the heavily doped regions 132,134 connected with its neighboring one to form a conductive path 130. The conductive path 130 would be utilized for applying drain voltage in the present embodiment.

Figure 2D:
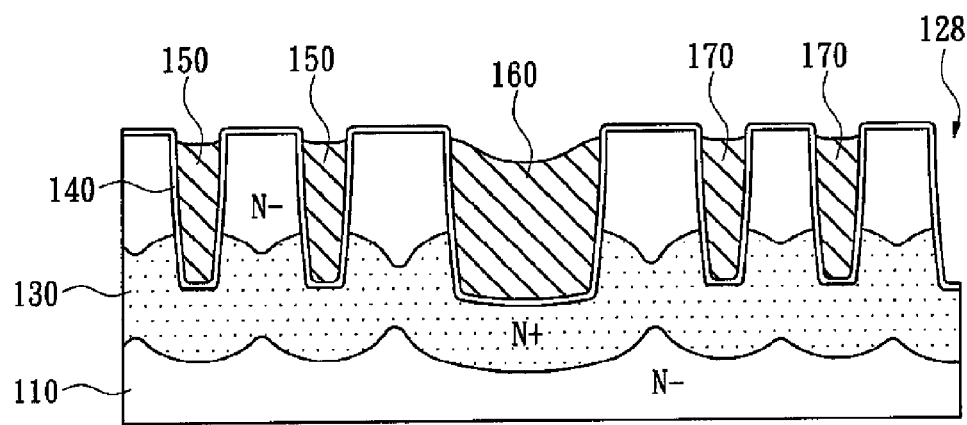

Next, as shown in FIG. 2D, a dielectric layer 140 is formed on the inner surfaces of the trenches 122,124,126, and then the gate structure 150, the gate bus 160, and the termination structure 170 are formed in the gate trench 122, the first trench 124, and the second trench 126 respectively. In the present embodiment, the gate structure 150, the gate bus 160, and the termination structure 170 are simultaneously formed in the trenches 122,124,126. For example, a polysilicon deposition step and an etching back step can be used. However, the present invention is not so restricted. The gate structure 150, the gate bus 160, and the termination structure 170 may be fabricated by using different processes. For example, the termination structure 170 may be fabricated in a separated fabrication step to show a structure different from that of the gate structure 150.

Figure 2E:
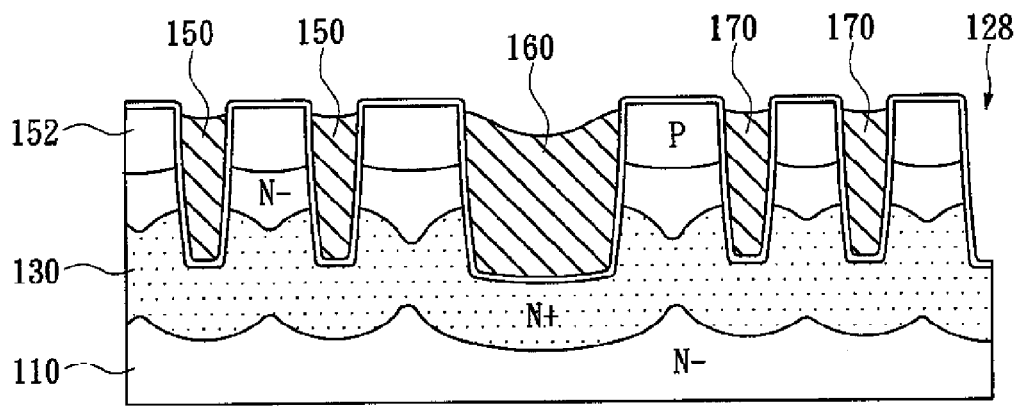
Figure 2F:
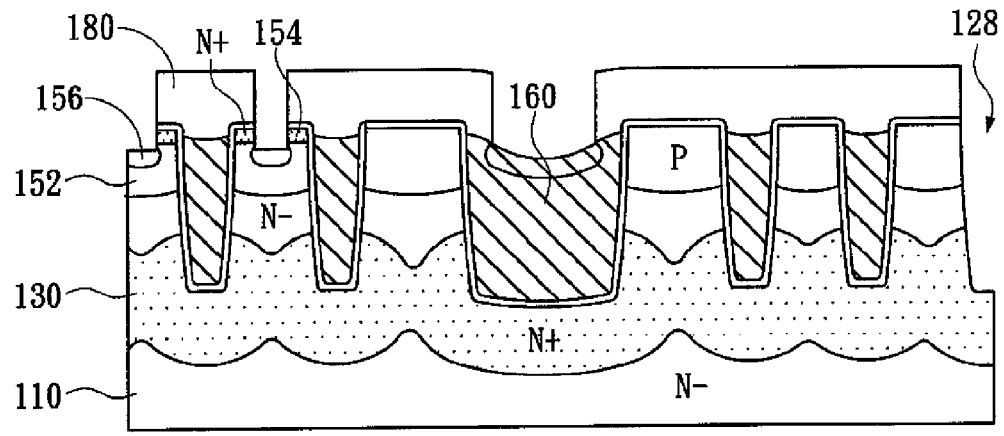

Next, as shown in FIG. 2E, the P-type wells 152 are formed in the N-type lightly doped substrate 110 between neighboring gate structures 150 by using the ion implantation step. It is noted that, the implantation depth of the P-type wells 152 should be adequately controlled to maintain a predetermined distance between the P-type wells 152 and the conductive path 130 so as to guarantee a sufficient breakdown voltage. Thereafter, as shown in FIG. 2F, the N-type surface regions 154 for applying the source voltage are formed in the P-type wells 152, and then an interlayer dielectric layer 180 is deposited over the N-type lightly doped substrate 110 with a plurality of opens therein to expose the P-type wells 152, the N-type surface regions 154, the gate bus 160, and the contact window 128. Then, a P-type heavily doped region 156 is formed in the P-type wells 152 for reducing contact resistance. It is noted that during the step of forming the opens in the interlayer dielectric layer 180, the dielectric layer 140 lining the inner surface of the contact window 128 is removed to expose the conductive path 130 at the bottom of the contact window 128.

Figure 2G:
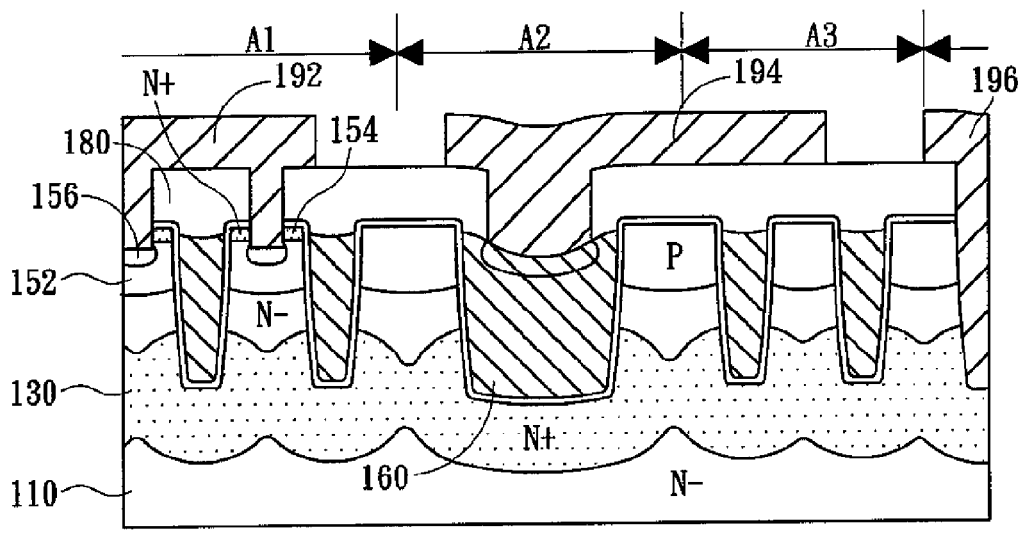

Next, as shown in FIG. 2G, three independent conductive structures 192,194,196 are formed on the interlayer dielectric layer 180 to electrically connect the N-type surface regions 154, the gate bus 160, and the conductive path 130 for applying the source voltage, the gate voltage and the drain voltage respectively.

The description of P-type and N-type in the present embodiment is not intended to restrict the scope of the present invention. The fabrication method provided in the present embodiment can be used to manufacture trenched power semiconductor devices on a P-type lightly doped substrate with no doubt.

As shown in FIGS. 2B and 2C, in the step of forming the trenches 122,124,126 by etching, the contact window 128 is simultaneously formed adjacent to the edges of the light doped substrate 110, and in the following step of forming the trench-bottom heavily doped regions 132 by using the ion implantation process, the window-bottom heavily doped region 134 is simultaneously formed at the bottom of the contact window. The trench-bottom heavily doped regions 132 are electrically connected to the conductive structure 196 through the window-bottom heavily doped region 134. However, the present invention is not so restricted. For example, the contact window 128 may be formed in the lightly doped substrate 110 after the formation of the gate structure 150. In addition, with the location of the contact window 128 being properly adjusted, the contact window 128 may be extended to the trench-bottom heavily doped region 132 below the neighboring trench and the window-bottom heavily doped region 134 can be skipped. For example, by slicing some material on the side surface of the lightly doped substrate 110, the contact window 128 would be formed to expose the trench-bottom heavily doped region 132.

In contrast with the traditional manner, the fabrication method of the present embodiment, which features the usage of N-type lightly doped substrate 110 and the formation of trench-bottom heavily doped regions 132 as the conductive path 130 between the source electrode and the drain electrode, is able to save the cost of the N-type epitaxial layer and the metal layer on the backside of the substrate. Secondly, in accordance with the present embodiment, because the conductive path 130 for applying the drain voltage is adjacent to the bottom of the trenches 122, 124, and 126, the thickness of the N-type lightly doped region between the surface regions 154 and the conductive path 130 can be reduced to improve on-resistance. In addition, the drain conductive structure 196 on the top surface of the substrate 110 also facilitates the following packaging processes.

Figure 3A:
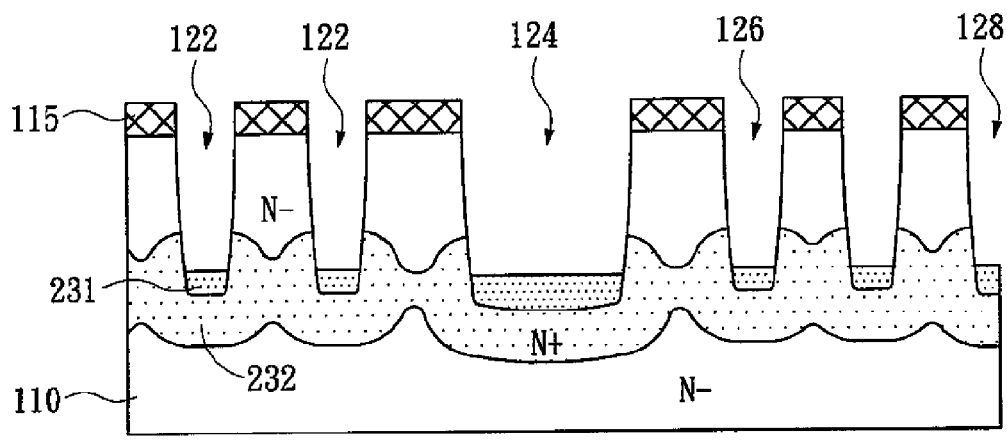
FIGS. 3A and 3B are schematic views showing a fabrication method of a trenched MOSFET in accordance with a second embodiment of the present invention.
Figure 3B:
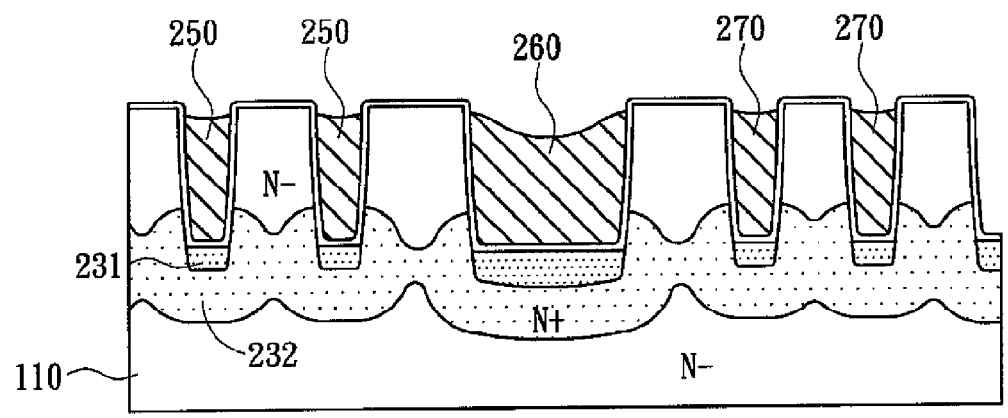

FIGS. 3A and 3B are schematic views showing a fabrication method of a trenched MOSFET in accordance with a second embodiment of the present invention. The fabrication step as shown in FIG. 3A is next to the fabrication step of FIG. 2B. As shown in FIG. 3A, different from the first embodiment, which adopts an ion implantation step to form the trench-bottom N-type heavily doped regions 132, the present embodiment fills the bottom portions of the gate trench 122, the first trench 124, and the second trench 126 with N-type heavily doped epitaxial structures 231 as a dopant source. Then, a thermal diffusion step is carried out to diffuse the dopants in the N-type heavily doped epitaxial structures 231 so as to form a plurality of trench-bottom heavily doped regions 232 connected in a serial in the N-type lightly doped substrate 110. Then, as shown in FIG. 3B, the gate structure 250, the gate bus 260, and the termination structure 270 are formed in the gate trench 122, the first trench 124, and the second trench 126 respectively. The following steps of the present embodiment are similar to that of the first embodiment, and thus are not repeated here.

Figure 4A:
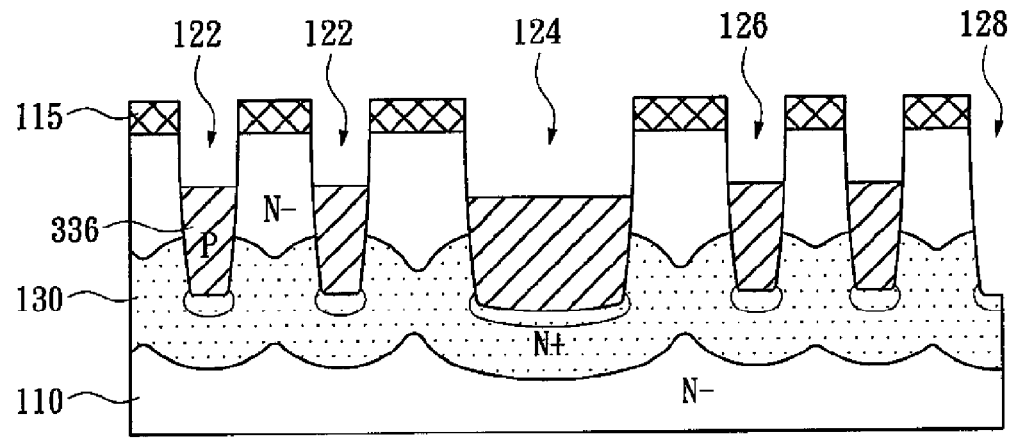
FIGS. 4A and 4B are schematic views showing a fabrication method of a trenched MOSFET in accordance with a third embodiment of the present invention.
Figure 4B:
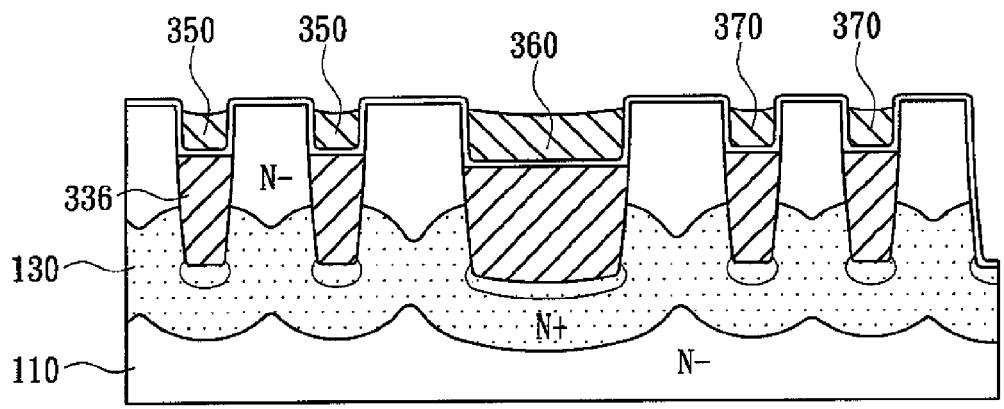

FIGS. 4A and 4B are schematic views showing a fabrication method of a trenched MOSFET in accordance with a third embodiment of the present invention. The fabrication step as shown in FIG. 4A is next to the fabrication step of FIG. 2C. As shown in FIG. 4A, after the step of forming the drain region 130 in the N-type lightly doped substrate 110 by using the thermal diffusion step, the lower portion of the trenches 122, 124, and 126 are filled with epitaxial structures 336 for increasing gate to drain capacitance. The epitaxial structures 336 may be of P-type doped or N-type lightly doped, and the P-type epitaxial structures 336 are used in the present embodiment. Then, as shown in FIG. 4B, the gate structure 350, the gate bus 360, and the termination structure 370 are formed in the space right above the epitaxial structures 336. The following steps of the present embodiment are similar to that of the first embodiment and thus are not repeated here.

Figure 5A:
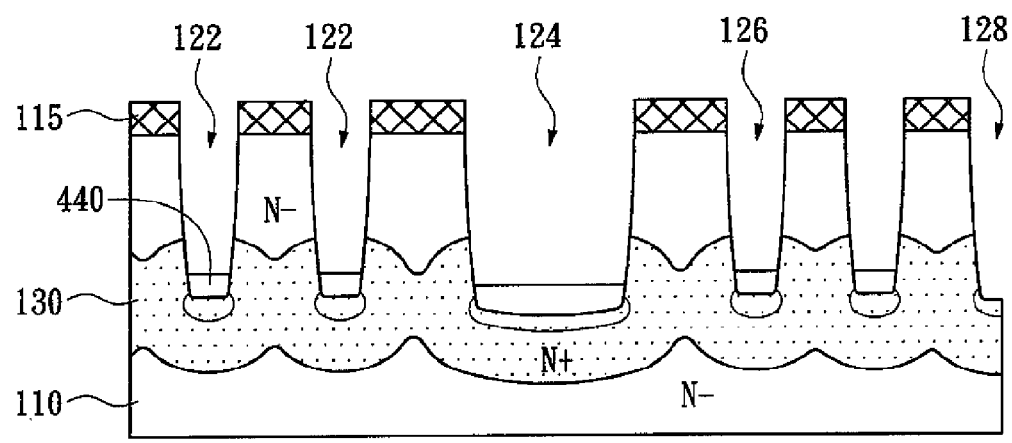
FIGS. 5A and 5B are schematic views showing a fabrication method of a trenched MOSFET in accordance with a fourth embodiment of the present invention.
Figure 5B:
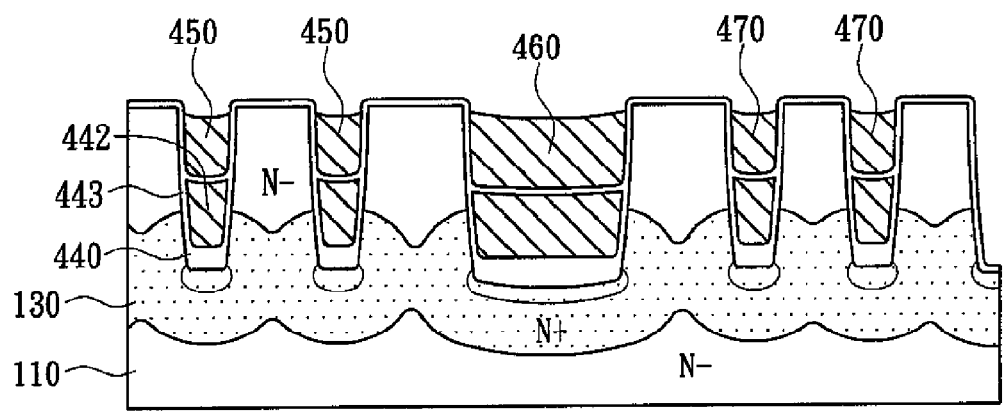

FIGS. 5A and 5B are schematic views showing a fabrication method of a trenched MOSFET in accordance with a fourth embodiment of the present invention. The fabrication step as shown in FIG. 5A is next to the fabrication step of FIG. 2C. As shown in FIG. 5A, after the step of forming a conductive path 130 in the N-type lightly doped substrate 110 by using the thermal diffusion step, a thick oxide layer 440 is formed at the bottom of the trenches 122, 124, and 126 for reducing gate to drain capacitance. The thick oxide layer 440 may be formed by using a selectively oxidation step or an oxide deposition and etching step. Thereafter, as shown in FIG. 5B, a conductive structure 442, such as a doped polysilicon structure, is formed in the lower portion of the trenches 122, 124, 126 for reducing gate to drain capacitance. The side surface of the conductive structure 442 and the conductive path 130 are separated by a dielectric layer 443. Then, the gate structure 450, the gate bus 460, and the termination structure 470 are formed in the upper portion of the gate trench 122, the first trench 124, and the second trench 126 respectively. In the present embodiment, although the conductive structure 442 and the gate structure 445 are separated by a dielectric layer, the potential of the conductive structure 442 would be positively related to the potential of the gate structure 445.

Figure 6:
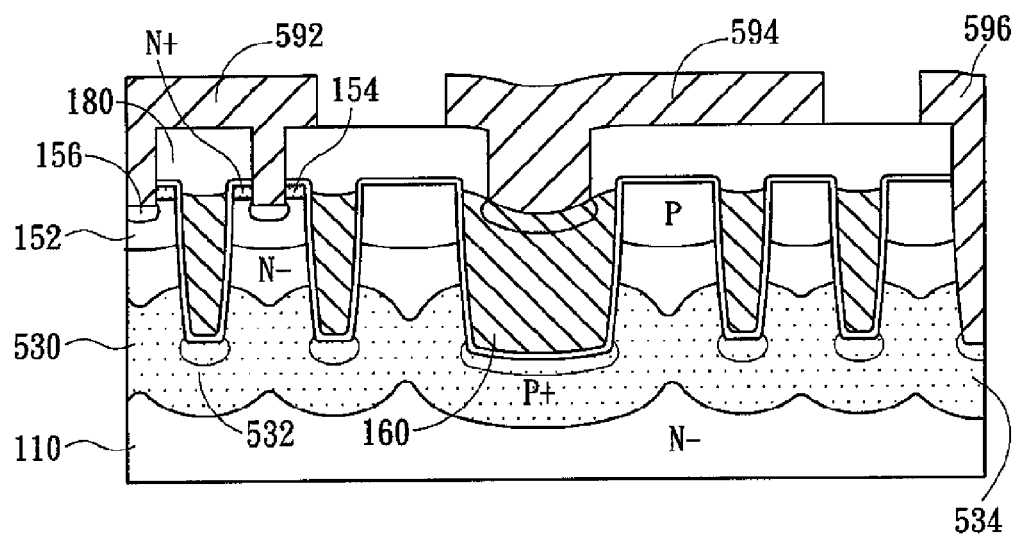
FIG. 6 is a schematic view showing an trenched insulated gate bipolar transistor (IGBT) in accordance with a preferred embodiment of the present invention.

FIG. 6 is a schematic view showing an insulated gate bipolar transistor in accordance with a preferred embodiment of the present invention. In contrast with the first embodiment of the present invention, which features the N-type trench-bottom heavily doped regions 132 as the conductive path 130, in the present embodiment, the trench-bottom heavily doped regions 532 at the bottoms of the trenches 122,124,126 and the window-bottom heavily doped region 534 at the bottom of the contact window 128 are of P-type heavily doped. Thus, an alternative PNPN structure is formed between the conductive path 530 and the N-type surface region 154 as the insulated gate bipolar transistor (IGBT) structure. In the IGBT structure, the N-type surface region 154 is electrically connected to an emitter electrode through a conductive structure 592, and the trench-bottom heavily doped regions 532 are electrically connected to a collector electrode through a conductive structure 596.

The above mentioned embodiments for fabricating the power MOSFET can be applied to the formation of the IGBT according the modification described in FIG. 6. However, in the embodiment of FIGS. 4A and 4B, because of the P-type trench-bottom heavily doped regions 532, the epitaxial structures 336 at the lower portions of the trenches 122,124,126 must be of N-type doped.

Figure 7:
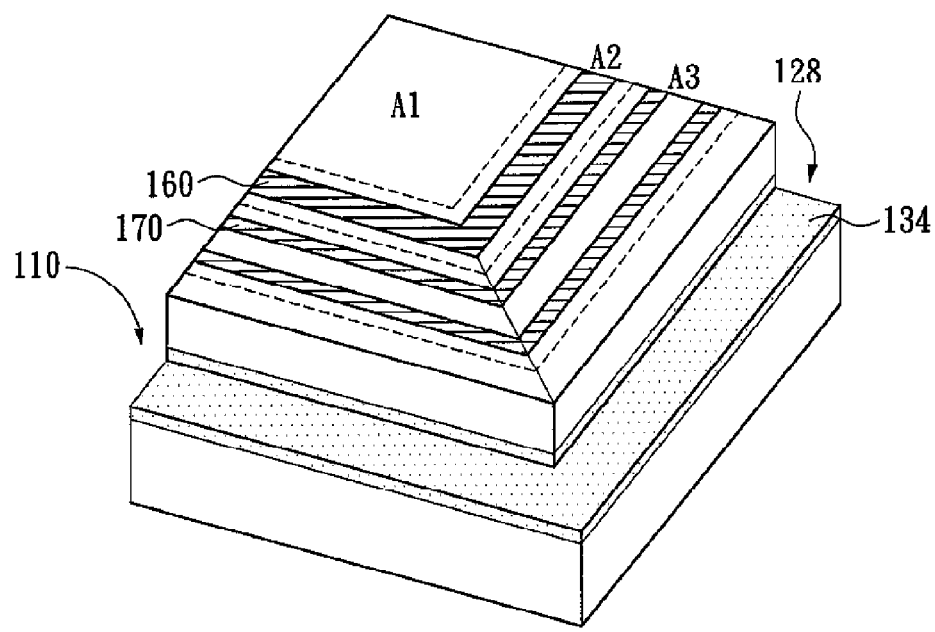
FIG. 7 is a schematic view showing the arrangement of the contact window of the trenched power semiconductor device in accordance with a preferred embodiment of the present invention.

FIG. 7 is a schematic view showing the arrangement of the drain contact window of the trenched power semiconductor device in accordance with a preferred embodiment of the present invention. The portion adjacent to a corner of the lightly doped substrate 110 is shown. As shown, the cell region A1 is located in a center portion of the light doped substrate 110, and the bus region A2 and the termination region A3 are located outside the cell region A1 in a serial. The contact window 128 shows a stepped structure surrounding the four edges of the substrate 110. However, the present invention is not so restricted. The contact window 128 may be merely located on a portion of the edges of the substrate 110 or on the top surface of the substrate 110. In addition, the contact window 128 may be a trench extending from a top surface of the substrate 110 to the conductive path 130.

Moreover, referring to FIG. 2G, the trench-bottom heavily doped region 132 below the gate structure 150 is electrically connected to the conductive structure 196 through the other trench-bottom heavily doped regions 132 below the gate bus 160 and the termination structure 170 according to the above mentioned embodiments. However, the present invention is not so restricted. According to layout of the cells, the gate bus 160, the termination structure 170, and the contact window 128, the gate structure 150 may be adjacent to the contact window 128, and the trench-bottom heavily doped region 132 below the gate structure 150 may be electrically connected to the conductive structure 196 directly.

In addition, referring to FIG. 2G, the open of the contact window 128 and that of the trenches 122, 124, 126 are located on the same surface (the top surface) of the lightly doped substrate 110. However, the present invention is not so restricted. The open of the contact window 128 may be formed on a back surface of the lightly doped substrate 110 or the drain contact window may be formed on the side surface of the lightly doped substrate 110 if needed.

In contrast with the traditional trenched power semiconductor devices, the present invention has the following advantages. Firstly, the fabrication method provided in the present invention is helpful for reducing fabrication cost by skipping the formation of the epitaxial layer on the substrate. Secondly, the conductive structure 196 moved to the top surface of the substrate 110 facilitates following packaging processes. Thirdly, the distance between the well 152 and the conductive path 130 can be shortened to reduce on-resistance of the trenched power semiconductor device.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a trenched power semiconductor device, comprising the steps of; a) providing a lightly doped substrate of a first conductive type; b) forming at least two trenches, which include at least a gate trench, in the lightly doped substrate; c) forming a contact window in the lightly doped substrate; d) forming at least two trench-bottom heavily doped regions at bottoms of the respective trenches; e) expanding the trench-bottom heavily doped regions by using thermal diffusion process to have the neighboring trench-bottom heavily doped regions connected with each other; f) forming a gate structure in the gate trench; and g) forming a conductive structure in the contact window for electrically connecting the trench-bottom heavily doped regions to an electrode.

2. The fabrication method of a trenched power semiconductor device of claim 1, wherein the trenches include at least a first trench for locating a gate bus, and the gate structure and the gate bus are simultaneously formed in the gate trench and the first trench respectively.

3. The fabrication method of a trenched power semiconductor device of claim 1, wherein the trenches include at least a second trench for locating a termination structure, and the gate structure and the termination structure are simultaneously formed in the gate trench and the second trench respectively.

4. The fabrication method of a trenched power semiconductor device of claim 1, wherein during the step of forming the trench-bottom heavily doped regions at the bottoms of the respective trenches, a window-bottom heavily doped region is simultaneously formed at a bottom of the contact window.

5. The fabrication method of a trenched power semiconductor device of claim 1, wherein the trench-bottom heavily doped regions are formed at the bottoms of the respective trenches by using ion implantation process.

6. The fabrication method of a trenched power semiconductor device of claim 1, before the step of forming the gate structure in the gate trench, further comprising the step of forming at least two epitaxial structures in lower portions of the respective trenches, and the epitaxial structures being of a second conductive type or of the lightly doped first conductive type.

7. The fabrication method of a trenched power semiconductor device of claim 1, wherein the contact window and the trenches are simultaneously formed on a top surface of the lightly doped substrate.

\* \* \* \* \*